United States Patent
Derderian et al.

(10) Patent No.: US 6,780,758 B1
(45) Date of Patent: *Aug. 24, 2004

(54) METHOD OF ESTABLISHING ELECTRICAL CONTACT BETWEEN A SEMICONDUCTOR SUBSTRATE AND A SEMICONDUCTOR DEVICE

(75) Inventors: Garo J. Derderian, Boise, ID (US); Gurtej S. Sandhu, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 170 days.

(21) Appl. No.: 09/146,108

(22) Filed: Sep. 3, 1998

(51) Int. Cl.[7] .......................................... H01L 21/4763
(52) U.S. Cl. .................... 438/630; 438/240; 438/627; 438/628; 438/643; 438/644; 438/653; 438/654; 438/664
(58) Field of Search ................................ 438/642, 643, 438/647, 648, 649, 650, 651, 653, 655, 656, 657, 674, 675, 683, 684, 685, 686, 238, 239, 242, 243, 244, 584, 597, 598, 605, 618, 625, 621, 622, 627, 628, 629, 630, 637, 639, 640, 644, 652, 654, 658, 664, 672, 673, 682

(56) References Cited

U.S. PATENT DOCUMENTS

| | | | | |
|---|---|---|---|---|
| 4,847,111 A | * | 7/1989 | Chow et al. | 427/38 |
| 5,173,327 A | * | 12/1992 | Sandhu et al. | 438/680 |
| 5,504,041 A | * | 4/1996 | Summerfelt | 438/396 |
| 5,506,166 A | * | 4/1996 | Sandhu et al. | 438/653 |
| 5,633,200 A | * | 5/1997 | Hu | 438/653 |
| 5,654,222 A | | 8/1997 | Sandhu et al. | 438/3 |
| 5,699,291 A | * | 12/1997 | Tsunemine | 365/149 |
| 5,851,896 A | | 12/1998 | Summerfelt | 438/396 |
| 5,895,268 A | * | 4/1999 | Mathews | 438/672 |
| 6,320,213 B1 | * | 11/2001 | Kirlin et al. | 257/295 |

* cited by examiner

Primary Examiner—George Fourson
Assistant Examiner—Julio J. Maldonado
(74) Attorney, Agent, or Firm—Charles Brantley

(57) ABSTRACT

In a semiconductor device using a polysilicon contact, such as a poly plug between a transistor and a capacitor in a container cell, an interface is provided where the poly plug would otherwise contact the bottom plate of the capacitor. The interface bars silicon from the plug from diffusing into the capacitor's dielectric. The interface can also include an oxygen barrier to prevent the poly plug from oxidizing during processing. Below the interface is a silicide layer to help enhance electrical contact with the poly plug. In a preferred method, the interface is created by selectively depositing a layer of titanium over a recessed poly plug to the exclusion of the surrounding oxide. The deposition process allows for silicidation of the titanium. The top half of the titanium silicide is then nitridized. A conformal ruthenium or ruthenium oxide layer is subsequently deposited, covering the titanium nitride and lining the sides and bottom of the container cell.

1 Claim, 17 Drawing Sheets

US 6,780,758 B1

METHOD OF ESTABLISHING ELECTRICAL CONTACT BETWEEN A SEMICONDUCTOR SUBSTRATE AND A SEMICONDUCTOR DEVICE

TECHNICAL FIELD

The present invention relates generally to a method of forming an interface for a silicon contact. More specifically, the invention relates to a barrier between two electrically conductive portions of a semiconductor device. In a particularly preferred implementation, the present invention relates to a diffusion barrier between a polysilicon plug and a capacitor plate that forms a part of a dynamic random access memory (DRAM).

BACKGROUND OF THE INVENTION

In the process of fabricating a memory cell for a DRAM or other memory device, it is often desirable to construct the capacitor portion of that memory cell so that the capacitor is elevated from the semiconductor substrate that supports the device. For example, it is known in the art to construct the access transistor portion of a memory cell relatively close to the surface of the substrate. The gate of the access transistor is above the substrate, separated only by a thin layer of oxide. Moreover, the source and drain of the access transistor are often doped portions of the substrate itself. It is further known to then provide an insulating layer, such as an oxide, over this access transistor and other devices, wherein the layer is thick enough to have a planar surface despite the features protruding from the substrate. A contact hole is etched through this oxide to one of the doped portions of the substrate and is filled with a conductive material, such as doped polycrystalline silicon, or polysilicon. The polysilicon filling this contact hole is often known as a poly plug. An additional layer of oxide is then formed over the first, and a container is etched from the additional oxide layer, wherein the bottom of the container corresponds with the top of the polysilicon plug. The capacitor is formed within this container. As part of this process, a layer of conductive material will be provided at least along the bottom of the container to serve as the capacitor's bottom plate. This step is followed by providing a dielectric layer over the bottom plate and a top plate over the dielectric layer. The contact between the bottom plate of the capacitor and the poly plug allows electrical communication between the bottom plate and between one of the transistor's doped substrate portions.

This known process raises several concerns. First, there is a tendency for the silicon in the poly plug to diffuse into the cell dielectric during fabrication, which decreases the performance of the capacitor. Second, there is a tendency for the poly plug to oxidize during the various processes performed after the poly plug is created. This oxidization inhibits the ability of the poly plug to channel electrical signals. These concerns are in addition to the fact that those skilled in the art are constantly striving to improve the electrical contact between the poly plug and the bottom plate of the capacitor. Moreover, such problems arise in other processes concerning silicon contacts, such as damascene processes.

SUMMARY OF THE INVENTION

Accordingly, the present invention provides a method of creating a silicon contact interface. In one exemplary embodiment, a diffusion barrier is provided during the fabrication of a memory cell and, more specifically, after forming the poly plug and before fabricating the capacitor portion of the memory cell. In a more specific embodiment, this barrier is created by siliciding and nitridizing a metal layer provided over the poly plug. In yet another exemplary embodiment, this diffusion barrier also serves as an oxidation barrier which protects the poly plug from oxidation. In still another exemplary embodiment, a second material is provided to act as the oxidation barrier. Other embodiments provide a diffusion barrier during the fabrication of other memory device elements, such as during a damascene process. Finally, the current invention also includes within its scope the products resulting from these processes.

DETAILED DESCRIPTION OF THE PREFERRED EMBODIMENTS

Figure 1A:
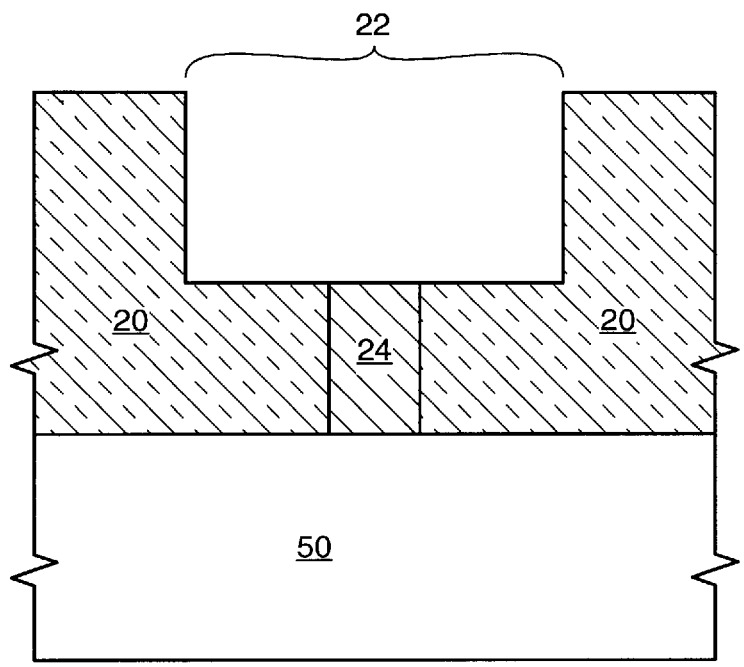
FIGS. 1A through 1C depict an in-process semiconductor device as is known in the art.

FIG. 1A depicts a portion of an in-process semiconductor device that, to this point, has been created by steps known in the art. An insulation layer 20 defines an opening 22, the bottom of which is generally level with the top of a portion of conductive material 24 that continues deeper into the insulation layer 20. The portion in FIG. 1A could be understood to represent one of several device portions at various stages of fabrication. For purposes of explanation, it will be assumed throughout most of the following discussion that FIG. 1A represents a portion of a memory cell, wherein opening 22 is actually a container 26, seen in FIG. 1B, designating the site where a capacitor will be formed. It follows then that the conductive material 24 in FIG. 1A can be more specifically identified as a poly plug 28 in FIG. 1B. Further, the insulating layer 20 is assumed to be an oxide 30, most likely silicon dioxide. Moreover, it is not necessary that one continuous insulation layer envelop the sides of both the container 26 and the poly plug 28. As seen in FIG. 1C, a second insulation layer 32 surrounds the sides of the poly plug 28 and defines the bottom of the container 26, while the oxide 30 defines the sides of the container 26. This is, in fact, the layering scheme that will occur if the process follows as described above in the background section. In addition, it is not necessary to use an oxide for the second insulation layer 32. In fact, it is preferable in the current invention if the second insulation layer 32 comprises a nitride at least around the poly plug 28, as this will help protect the poly plug 28 from oxidation during subsequent process steps. It should further be noted that, in illustrating a container cell/plug portion of a semiconductor device, it is understood that the poly plug 28 fills a hole extending down through the second insulation layer 32 and contacting the surface of the substrate 50, as seen in FIG. 1C. In the current application, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate" also refers to any supporting structure including, but not limited to, the semiconductive substrates described above.

At this point in the process, other devices, such as transistors, may flank the poly plug 28. Such elements and their placement in relation to the poly plug 28 and container 26 are well known in the art. Accordingly, they are omitted from the figures to more clearly illustrate the current invention.

Figure 1B:
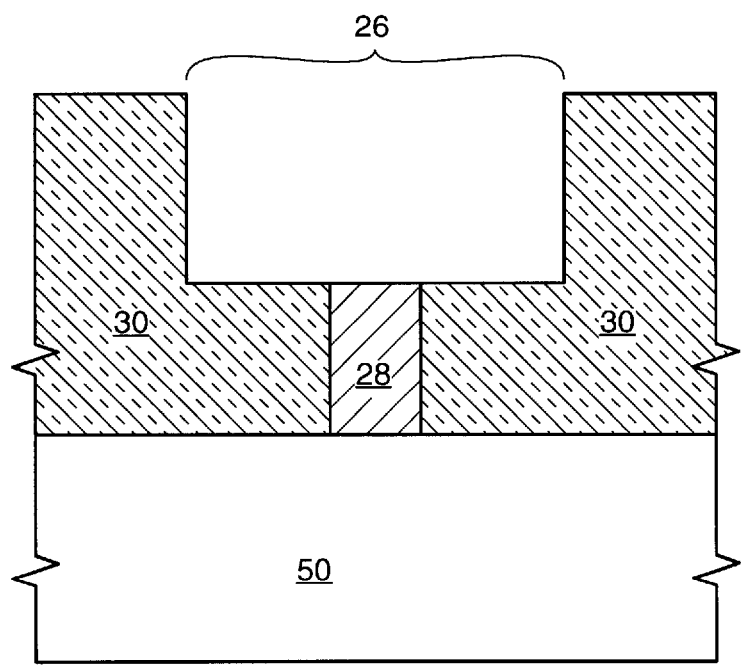
Figure 1C:
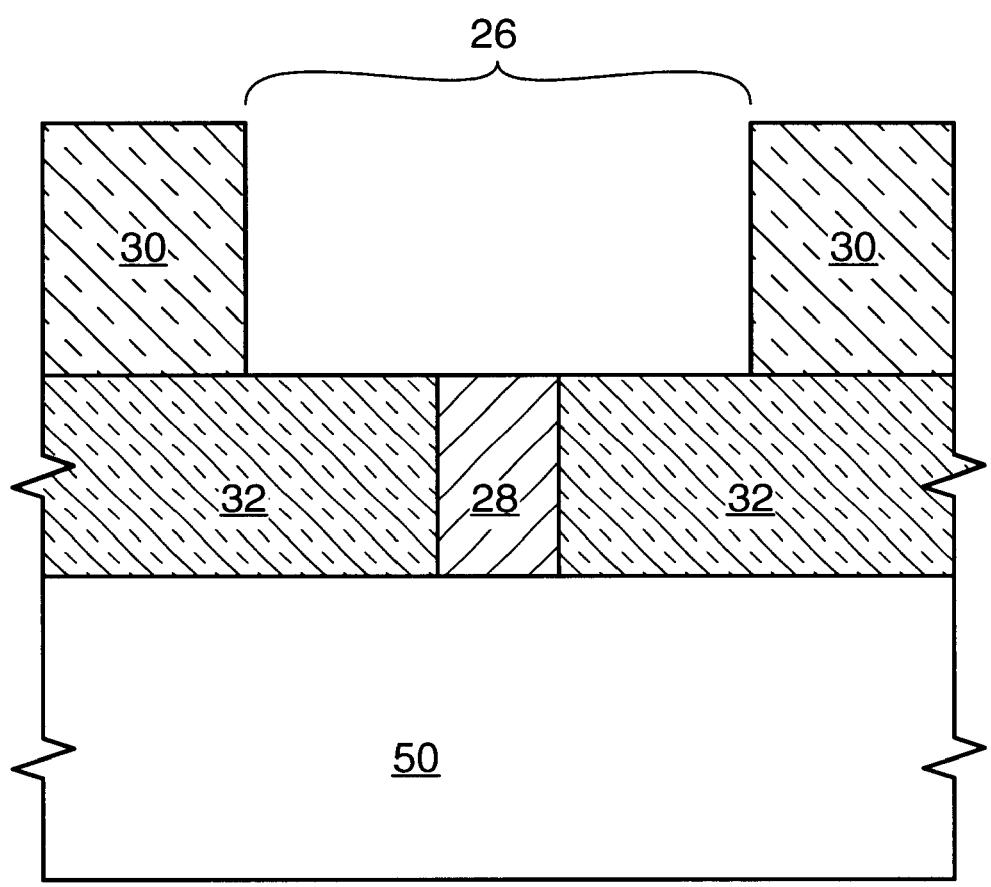

Although FIGS. 1A through 1C can represent a container cell/plug portion of a semiconductor device, these figures can also represent an in-process damascene structure, which can be used to form interconnects between a word or bit line and a memory cell. The use of the current invention under these circumstances will be addressed further below. It follows that FIGS. 1A–1C could represent other stages in other areas of a semiconductor device as well.

Figure 2:
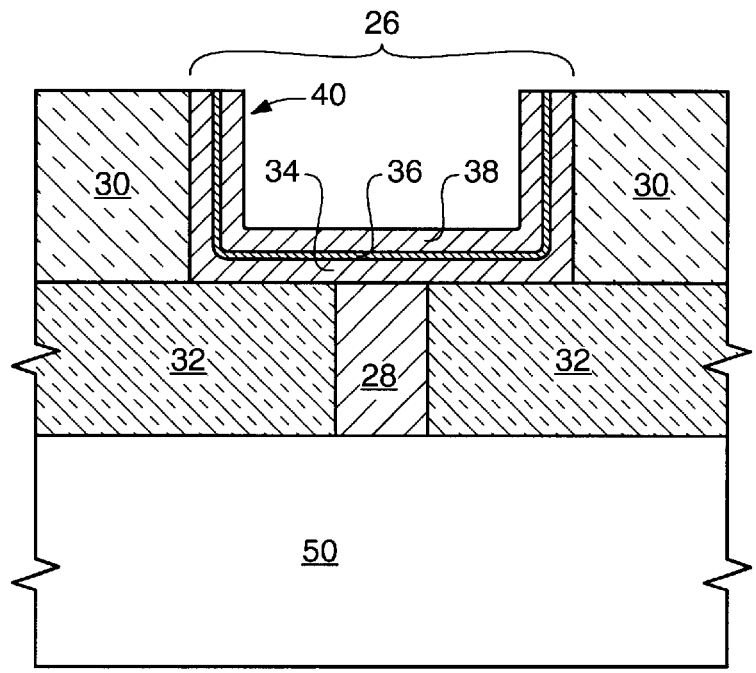
FIG. 2 illustrates a known configuration for a container cell capacitor.

Returning to the container cell/plug example, prior art teaches further processing as depicted in FIG. 2. A conductive material is layered along the sides and bottom of the container 26 to serve as a bottom plate 34, which in this case will be the storage node. A dielectric 36 is formed over the bottom plate 34, and another conductive material is layered over the dielectric 36 to form the top plate 38 which, in this embodiment, is the cell plate of the capacitor 40. Planarization and patterning of these layers 34, 36, and 38 are carried out as needed.

Figure 3:
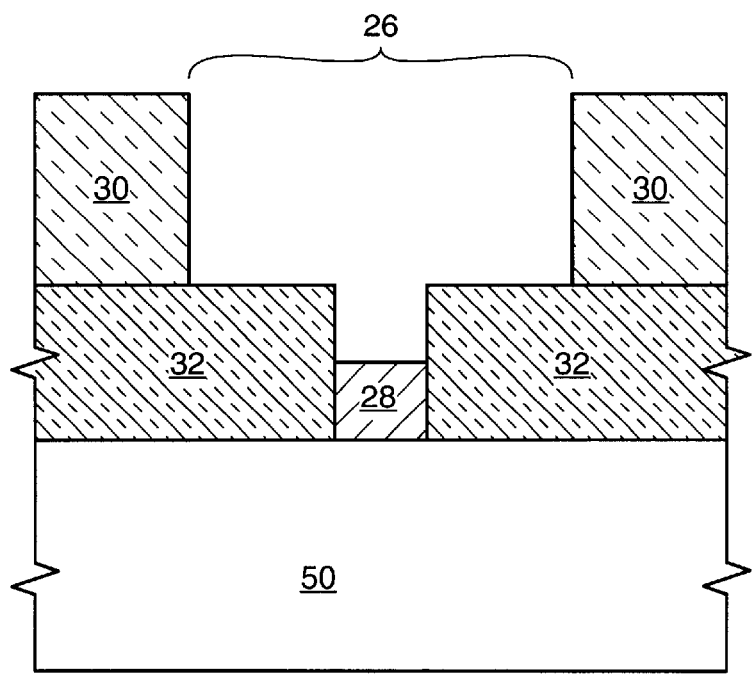
FIGS. 3, 4A through 4D, 5A through 5C, 6, and 7A through 7B represent steps that are taken in various exemplary method embodiments of the current invention.
Figure 8:
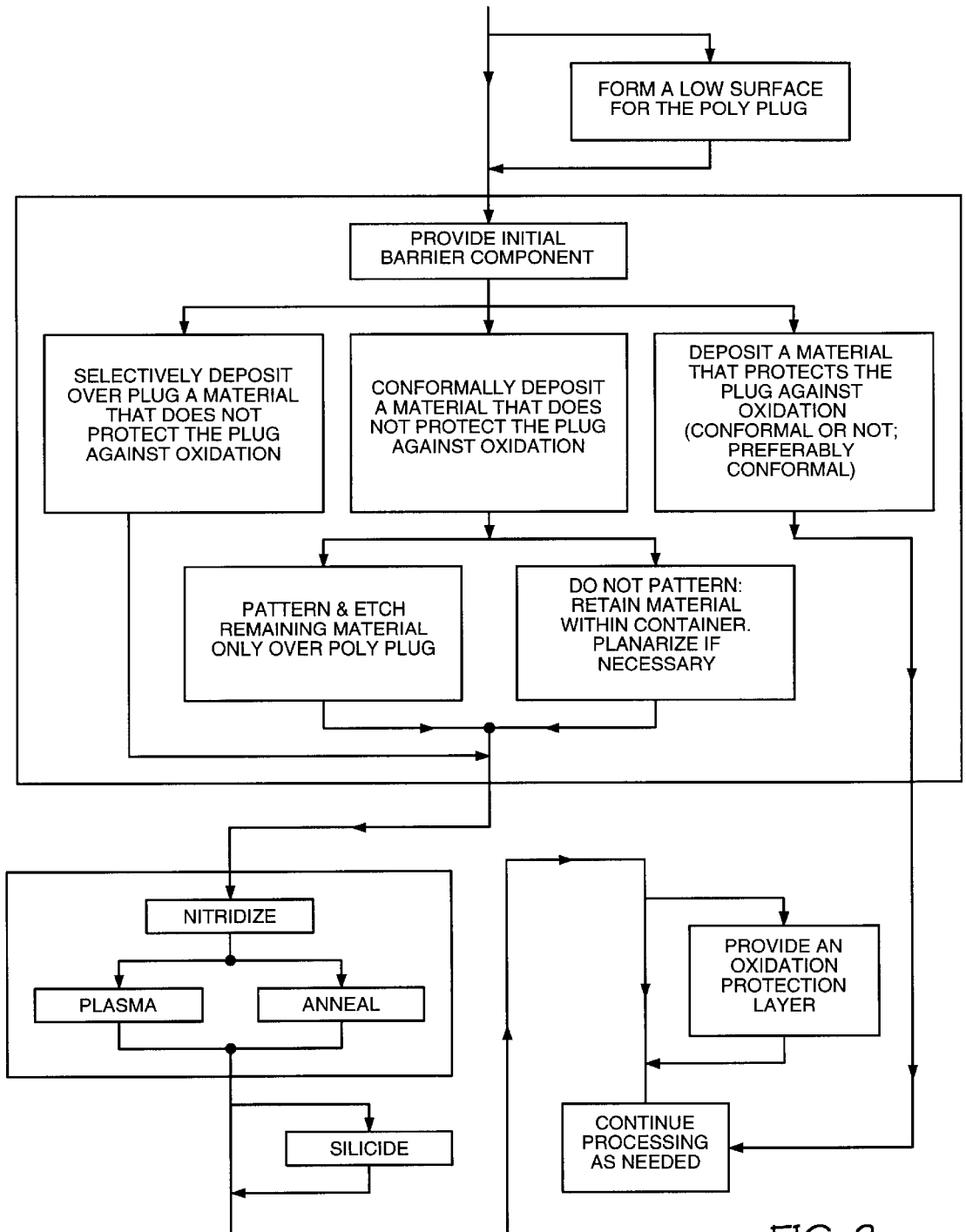
FIG. 8 is a process flow diagram organizing the steps depicted in FIGS. 3, 4A through 4C, 5A through 5C, 6, and 7A through 7B.

Because each step within the scope of the current invention may have several variations, FIG. 8 provides a flow chart which encompasses the embodiments that are graphically depicted in other figures included within this application. Accordingly, FIG. 8 serves to supplement the discussion below. FIG. 3 illustrates the first step in a preferred embodiment of the current invention, wherein a poly plug 28 is formed having a surface at a level below the bottom of the container 26. Preferably the surface of the poly plug 28 is about half-way between the bottom of the container 26 and the substrate 50. This can be achieved by forming polysilicon up to the bottom of the container 26 and subsequently recessing the poly plug 28 to a lower height through etching or other methods known in the art. Alternatively, the deposition process used to form the poly plug 28 could be halted before reaching the bottom of the container 26. While this step of forming a low or recessed surface for the poly plug 28 is not required by the current invention, it is preferred because it helps protect the sides and corners of the poly plug 28 from oxidation during further processing.

The next step comprises providing an initial barrier component 42 over the poly plug 28. This material is designated as an initial barrier component because, while initially it may not act as a diffusion barrier, the material at least contains components that can be used to create a barrier to the diffusion of silicon. In a preferred embodiment shown in FIG. 4A, the initial barrier component 42 is the result of selectively depositing titanium through chemical vapor deposition (CVD) onto the poly plug 28. The CVD process can be carried out under the following exemplary parameters: $TiCl_4$ for a source gas; $H_2$ for a reactive gas, wherein the flow rate of $H_2$ may be 2–10 times that of $TiCl_4$; Ar or He for carrier gasses; a substrate temperature of around 400 degrees C; a reaction chamber pressure ranging from 0.2 to 2 torr; with an rf voltage applied to the reaction chamber.

See, e.g., U.S. Pat. No. 5,173,327 by Sandhu et al. As a result of the selective CVD process, a layer of titanium will deposit only on the poly plug 28. The temperatures reached during the process, however, are sufficient to cause the titanium to react with the silicon in the poly plug 28 to form titanium silicide ($TiSi_x$, where x is a positive number). It is possible to deposit relatively unreacted titanium onto the poly plug 28 at low enough temperatures, and the current invention certainly includes such a process and apparatus within its scope. However, it is actually preferable under the current invention to have a silicide layer above the poly plug 28, as such a layer will enhance electrical contact between the poly plug 28 and any overlying conductive material. Thus, if providing an initial barrier component 42 does not inherently result in an electrical contact enhancement material, then it is preferred that an additional step be taken to create such a material. Such a step is described further below, but for now, it is assumed that the selectively deposited initial barrier component 42 underwent silicidation during deposition, thereby forming an electrical contact enhancement layer 48 above the poly plug 28, as seen in FIG. 4B. Specifically, the CVD'd titanium underwent silicidation during CVD to form $TiSi_x$.

Preferably only a monolayer of titanium silicide about five angstroms thick is formed, although it is not unusual to have a layer ranging from about five to 200 angstroms. For purposes of further explaining the current invention, it is assumed that the electrical contact enhancement layer 48 is a 100 angstrom-thick layer of titanium silicide.

It should be understood, however, that the initial barrier component 42 could comprise a different material as long as that material, either as initially deposited or with further processing, will help protect against the diffusion of silicon. Such materials include tungsten; rhenium; platinum group metals including platinum, palladium, iridium, ruthenium, rhodium, and osmium; oxides of those Pt-group metals, such as ruthenium oxide ($RuO_x$, where x is a non-negative number, preferably 2); alloys of those Pt-group metals; and transition metal borides including TiB. Titanium is a preferred material because it is relatively easy to selectively deposit. Nevertheless, using ruthenium oxide for the initial barrier component 42 is an alternative preferred embodiment. As discussed below, it is sometimes desirable to provide a layer above the poly plug 28 to protect it from oxidation. For such a layer, selective deposition is not necessary. In some embodiments, this requires a layer in addition to the diffusion barrier. Ruthenium oxide, however, may have the benefit of acting as both a barrier against silicon diffusing from the poly plug 28 as well as a barrier against oxygen that might otherwise reach the poly plug 28. Accordingly, if ruthenium oxide is the material of choice for the initial barrier component 42, as shown in FIG. 4D, then that material may serve as both the diffusion barrier 44 and the oxidation protection layer 46. One skilled in the art may then proceed to forming the capacitor 40, comprising layers 34, 36, and 38, in the manner described above. The ruthenium oxide will serve as an interface—a common boundary—between the two conductive elements which, in this case, are the poly plug 28 and the bottom plate 34. Again, planarization of the layers, including the diffusion barrier 44/oxidation protection layer 46, as well as patterning steps, are carried out as needed. Similarly, if iridium is chosen for the initial barrier component 42, it, too, may act as both the diffusion barrier 44 and the oxidation protection layer 46 shown in FIG. 4D. Moreover, any material from the platinum metal group (including platinum, rhodium, palladium, and osmium) and their corresponding metal oxides may also serve dual roles as a diffusion barrier 44 and an oxidation protection layer 46.

Thus selectivity, while preferred in certain embodiments, is not a necessary requirement under the current invention.

Figure 4A:
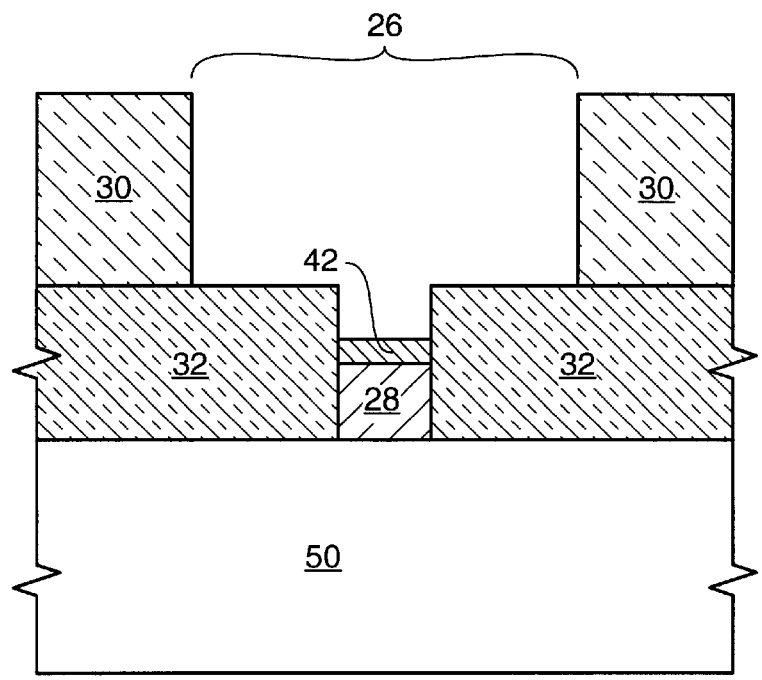
Figure 4B:
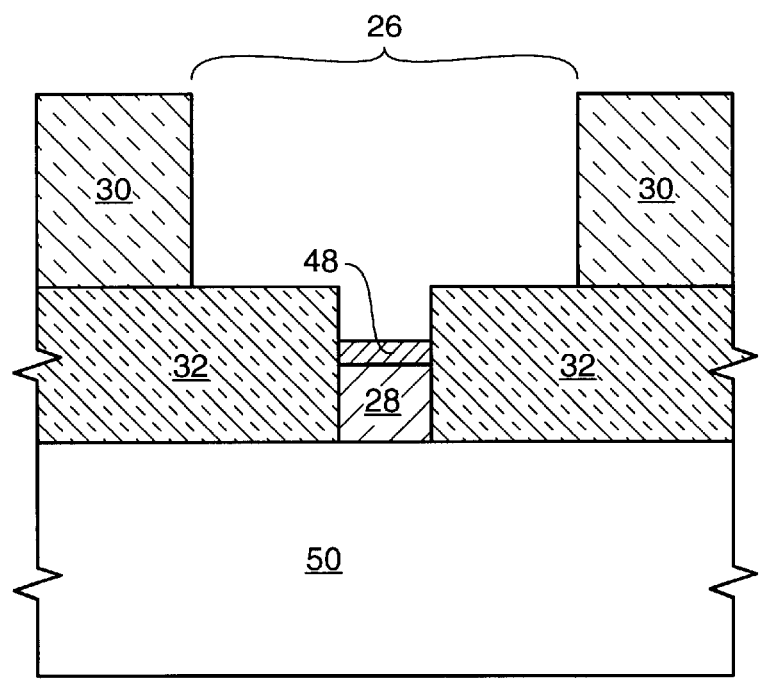
Figure 4C:
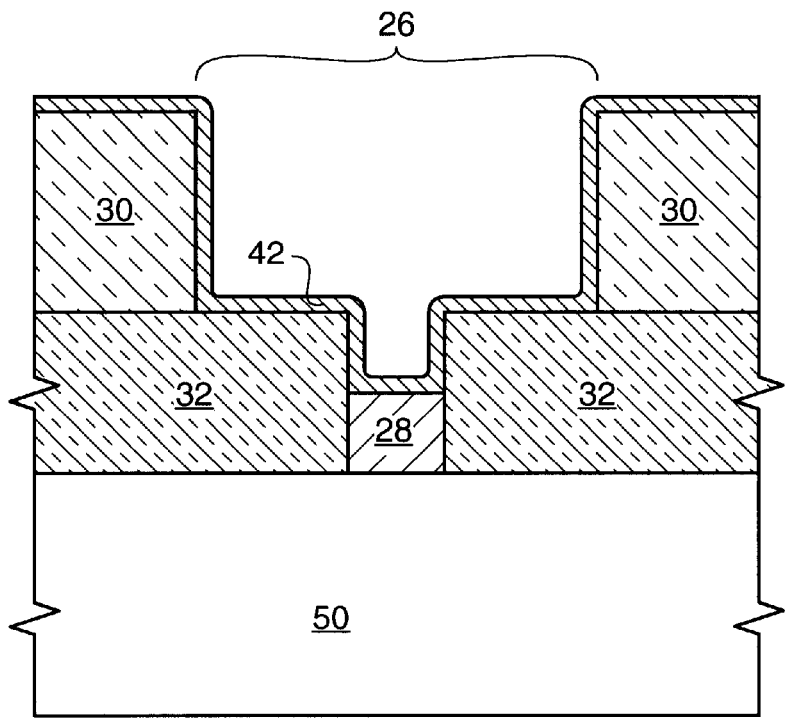
Figure 4D:
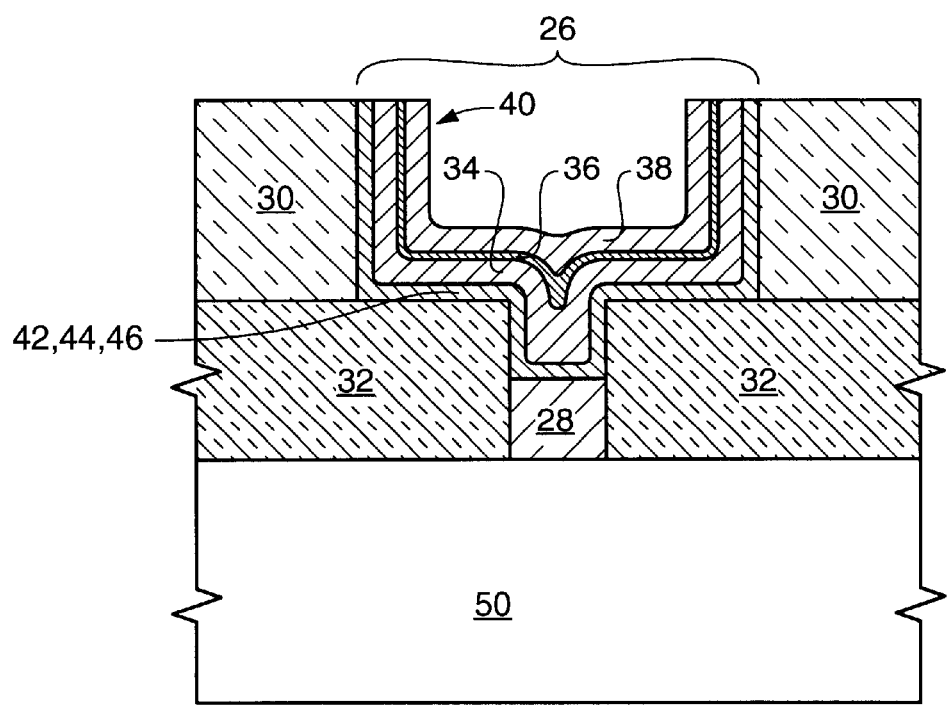

It may be more desirable in some embodiments to deposit a conformal initial barrier component 42 and then pattern the initial barrier component so that it remains only over the poly plug 28, as illustrated in FIG. 4A. Alternatively, it is possible to allow the conformally deposited initial barrier component 42 to remain as a lining along the container 26, as shown in FIG. 4C, with a planarization step taken if it is necessary to restrict the initial barrier component 42 to within the container 26. If tungsten is used as the initial barrier component 42, for example, CVD parameters would include using $WF_6$ and $H_2$ as precursors at 450 degrees C and at a pressure of 80 torr. See, e.g., U.S. Pat. No. 5,654,222 by Sandhu et al.

Figure 5A:
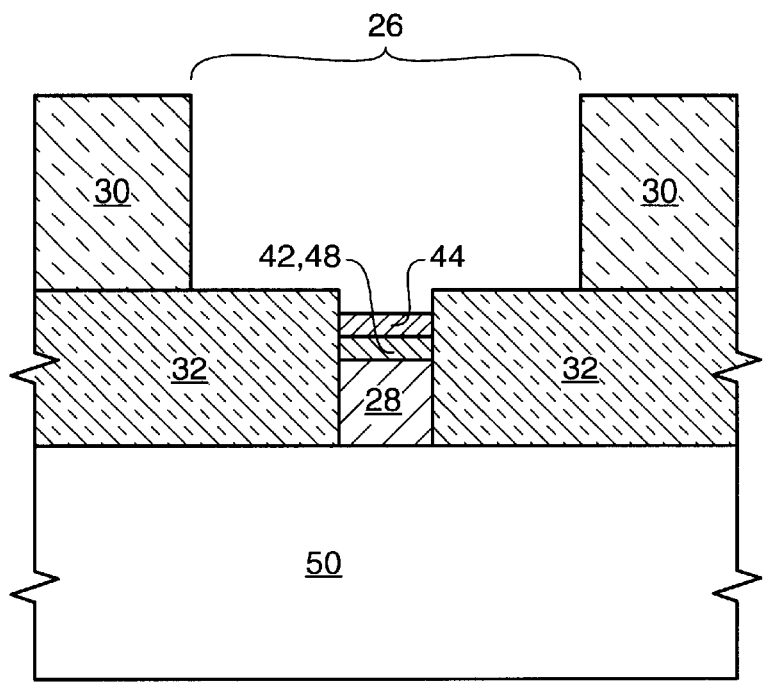
Figure 5B:
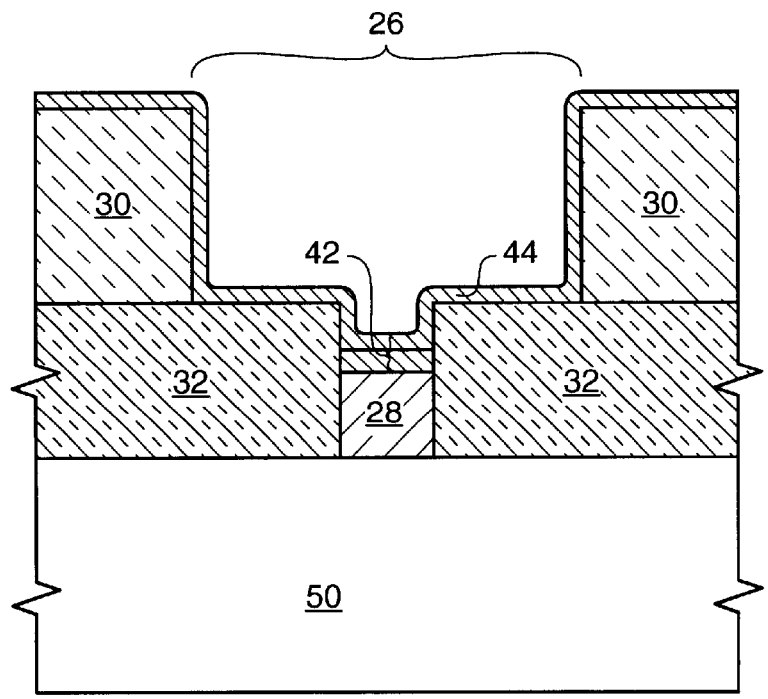
Figure 5C:
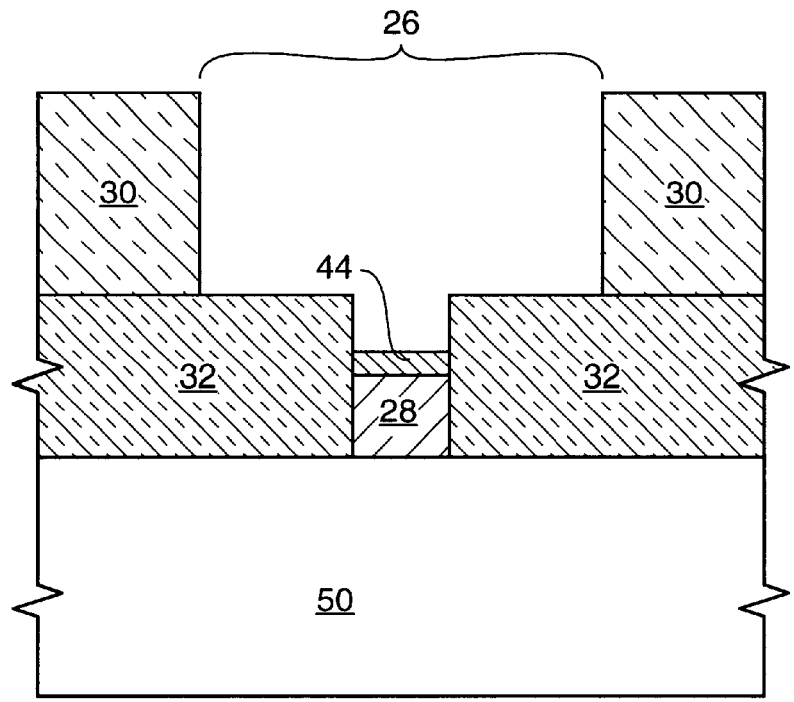

Returning to the preferred embodiment in which titanium silicide is used as the electrical contact enhancement layer 48, the process moves from the step depicted in FIG. 4A to a nitridation step, the result of which is illustrated in FIG. 5A. It is preferred that the nitridation be carried out using an $N_2/H_2$ plasma. Parameters for this process include a temperature of around 600 to 675 degrees Celsius, a pressure of about 1 torr, a power of about 500 watts, and a flow rate generally ranging from 10 to 1000 sccm for the $N_2$ and $H_2$ gasses. This process continues until a titanium nitride (TiN) layer about 50 angstroms thick is created from the initial barrier component 42. This results in having nitridized about one-half of the electrical contact enhancement layer 48. As seen in FIG. 5A, the TiN layer serves as one embodiment of the diffusion barrier 44 sought under the current invention. While alternate embodiments of the current invention may call for fully nitridizing the initial barrier component 42, as seen in FIG. 5C, it is preferred to retain a portion of un-nitridized titanium silicide for improved electrical communication. In embodiments where the initial barrier component 42 has yet to become an electrical contact enhancement layer 48, it is still preferable to retain an unnitridized portion of that layer, as it can later become an electrical contact enhancement layer 48 in a step described below. Regardless of the particular depth of the nitride, that material acts as a barrier to silicon, which has a tendency to diffuse from the poly plug 28 into the capacitor that is to be constructed in the container. Using a plasma process for nitridation is preferred because it can be done in situ—in relatively the same environment where the initial barrier component 42 was deposited. This reduces the risk of exposing the in-process device to contaminants.

Nevertheless, other nitridation methods fall within the scope of the current invention. Such methods include a thermal process such as an $N_2/NH_3$ anneal. This method would most likely be used if tungsten served as the initial material for the initial barrier component. In this case, the tungsten could be exposed to an $N_2/NH_3$ ambient under a pressure of approximately 4.5 torr and having a temperature of about 360 degrees C. Further, approximately 350 W of RF power could be applied to generate plasma from the gasses, which can occur in an $N_2:NH_3$ ratio ranging from 2:1 to 50:1, As for duration, this anneal process continues until the desired amount of tungsten nitride has been formed from the initial barrier layer. Thus, if the initial barrier component 42 is made of tungsten and covers only the poly plug 28, as in FIG. 4A, the nitridation step creates a tungsten nitride diffusion barrier 44, as represented in FIG. 5A. If, on the other hand, the initial barrier component 42 was a conformal layer of tungsten, represented by FIG. 4C, then the nitridation step would result in a conformal layer of tungsten nitride serving as the diffusion barrier 44. This is demonstrated in FIG. 5B, wherein the initial barrier component 42 has been partially nitridized. Further, if the initial barrier component 42 is made of ruthenium or any other Pt-group metal, the nitridation processes described above as well as others known in the art can be used to form a nitride diffusion barrier 44.

As a result, an interface is created by the above described process, wherein both the process and the resulting structure fall within the scope of the current invention. Accordingly, one skilled in the art could return to known steps and construct a capacitor within the container 26 and over the diffusion barrier 44.

Figure 6:
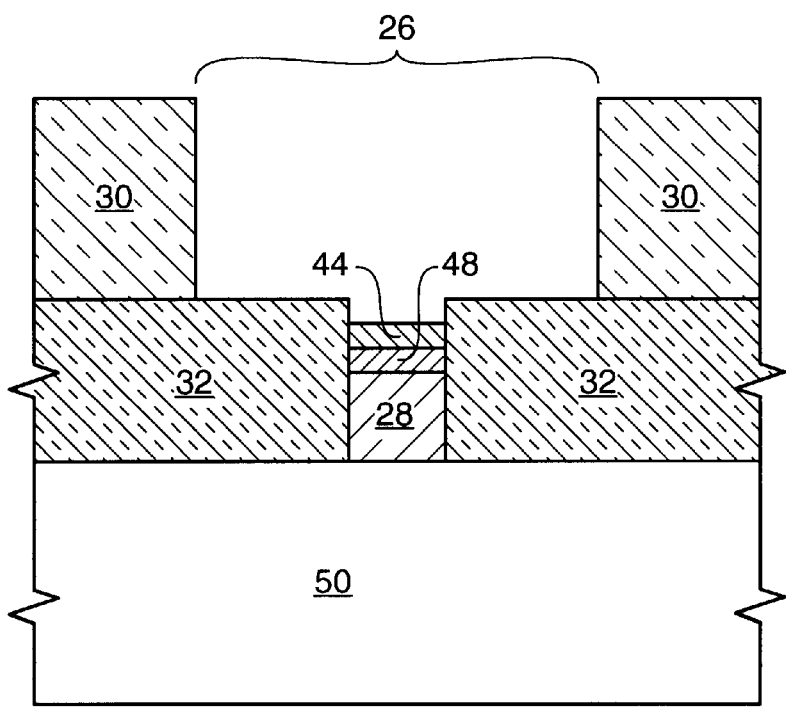

However, it is preferred in other embodiments to further develop the interface. If silicidation has not occurred by this point in the process, such a step may be performed now. As discussed above, this enhances the electrical contact between the poly plug 28 and the capacitor that will be constructed thereover. Assuming that (1) generally unreacted titanium has been selectively deposited as the initial barrier component 42, and (2) only the top 50 angstroms of the titanium has been nitridized, then at this step in this particular embodiment, the remaining 50 angstroms of titanium are changed into titanium silicide. Silicidation can be conducted using any known method but is preferably performed using a rapid thermal anneal process at about 650 degrees C for as long as necessary to achieve the desired amount of $TiSi_x$. The result of this process is depicted in FIG. 6: a $TiSi_x$ layer that acts as an electrical contact enhancement layer 48 is formed under the diffusion barrier 44. The formation of this electrical contact enhancement layer 48 helps to counteract the effects of any oxide within the poly plug 28 that has developed up to this point. Much of this oxidation occurs at the top of the poly plug 28. Thus, although a 50 angstrom measurement is used as an example thickness of the electrical contact enhancement layer 48, it is preferred that enough silicon in the poly plug 28 be reacted during silicidation so that a relatively oxide free portion of the poly plug 28 remains. This silicidation process may also be used in other embodiments, including those using unreacted tungsten as the initial barrier component 42, wherein silicidation will result in an electrical contact enhancement layer 48 made of tungsten silicide ($WSi_x$). Alternatively, silicidation of a ruthenium initial barrier component 42 will result in an electrical contact enhancement layer 48 made of ruthenium silicide. Similarly, if the initial barrier component 42 is rhenium or any Pt-group metal, silicidation will result in an electrical contact enhancement layer 48 comprising a silicide of the original material.

Still another step that could be performed includes providing an oxidation protection layer 46, which helps protect the poly plug 28 from oxidation during further processing. In several embodiments, this step involves the CVD of a metal, such as rhenium or the Pt-group metals. Alternatively, an oxide of these metals could be used for this layer 46. As another option, an alloy comprising a selection of the metals listed above could be used. As an example of this step, the CVD of ruthenium can be accomplished with a substrate temperature ranging from about 225 to 325 degrees Celsius (more preferably 250 degrees C) and a pressure of around 3 torr (more preferably 1 torr). Precursor chemistries include organoruthenium complexes, such as bis(cyclopenta-dienyl) ruthenium ($Ru(C_5H_5)_2$), triruthenium dodecacarbonyl ($Ru_3(CO)_{12}$), tricarbonyl (1,3-cyclohexadiene) ruthenium, and the like. Alternatively, a halogenated compound, such as ruthenium tetrachloride ($RuCl_4$), $RuCl_3$, or $RuF_5$ could be used. The CVD of ruthenium oxide involves a similar reaction but requires a lower temperature—around 150 degrees C—due to the addition of oxygen to the reaction.

Figure 7A:
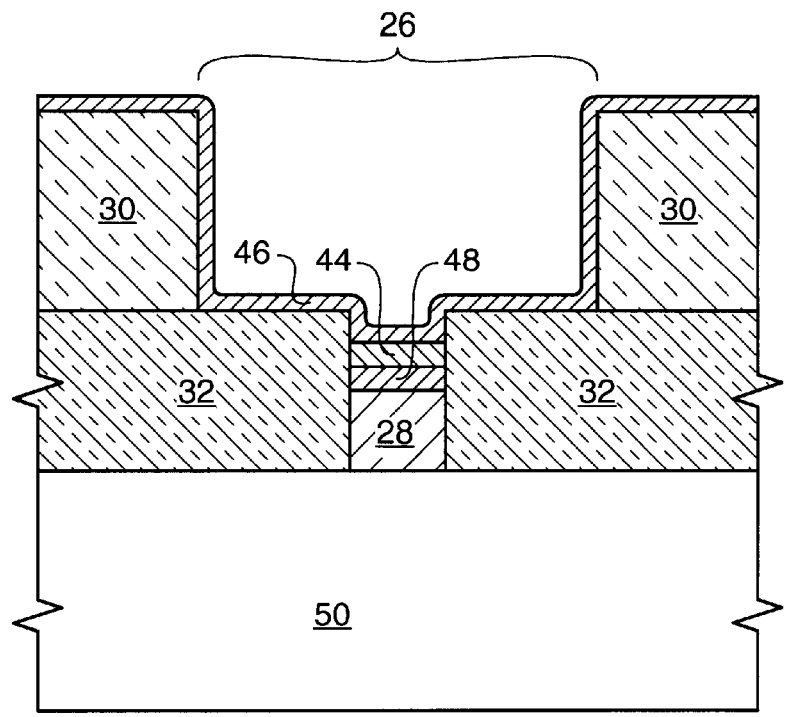
Figure 7B:
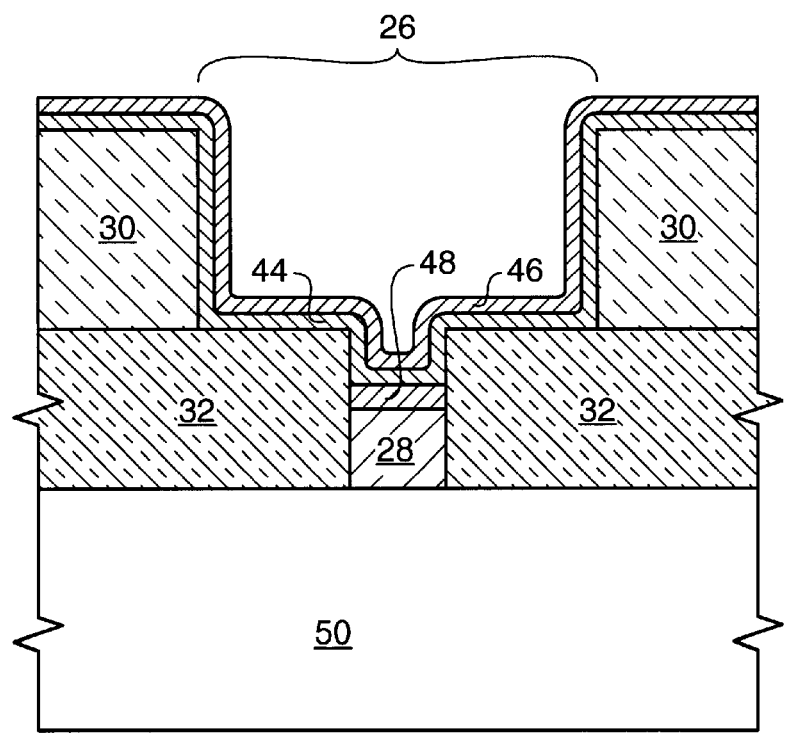

Regardless of the particular metal, metal oxide, or alloy deposited, the result appears in FIG. 7A, wherein a conformal oxidation protection layer 46 ranging from 1 to 300 angstroms in thickness lines the container 26 and overlies the diffusion barrier 44. The diffusion barrier 44, in turn, overlies the electrical contact enhancement layer 48, with the poly plug 28 under all of the above elements. FIG. 7B depicts the result in an embodiment wherein the diffusion barrier 44 is conformal to the container 26, and the oxidation protection layer 46 is conformal to the diffusion barrier 44. Once one skilled in the art provides the oxidation protection layer 46, he or she may continue with steps known in the art. In this case, that will entail building a capacitor, beginning with providing a conductive layer within the container 26 to serve as the capacitor's bottom plate.

Figure 9A:
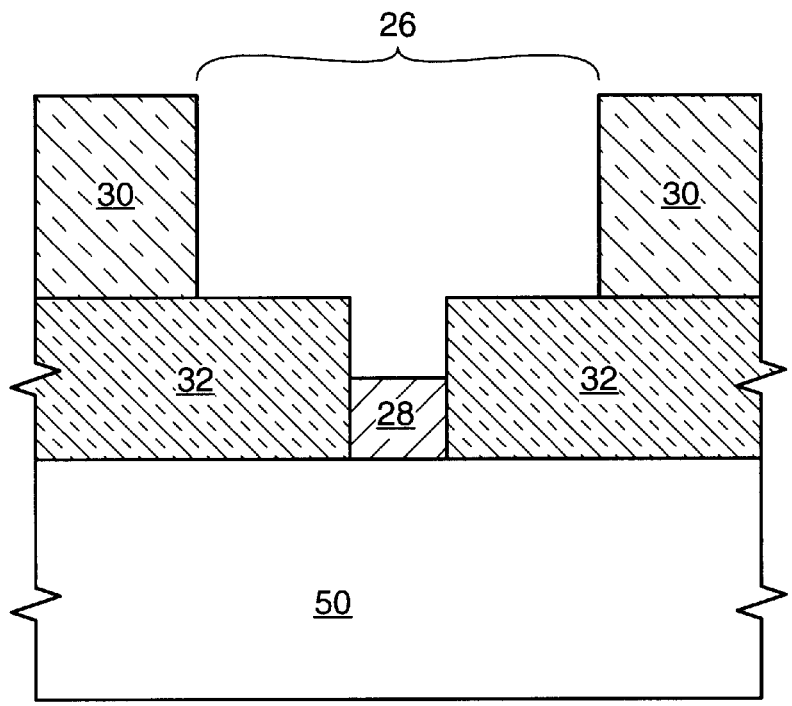
FIGS. 9A through 9E show one preferred exemplary embodiment of the current invention.
Figure 9B:
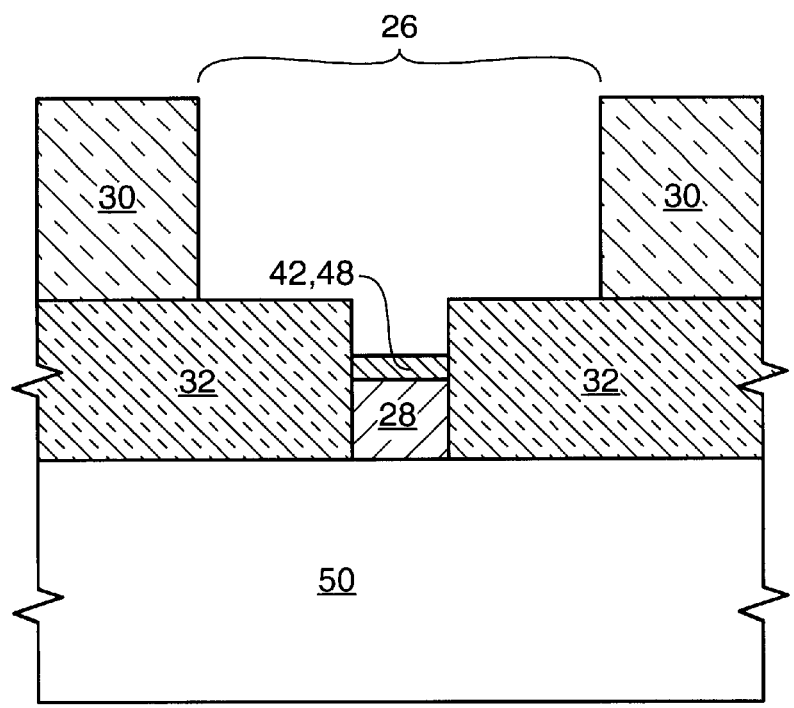
Figure 9C:
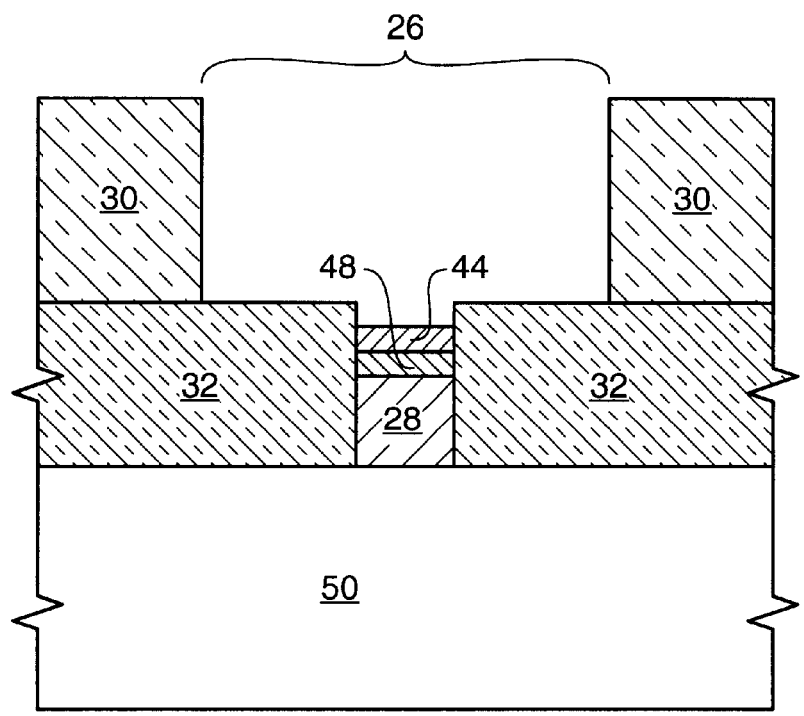
Figure 9D:
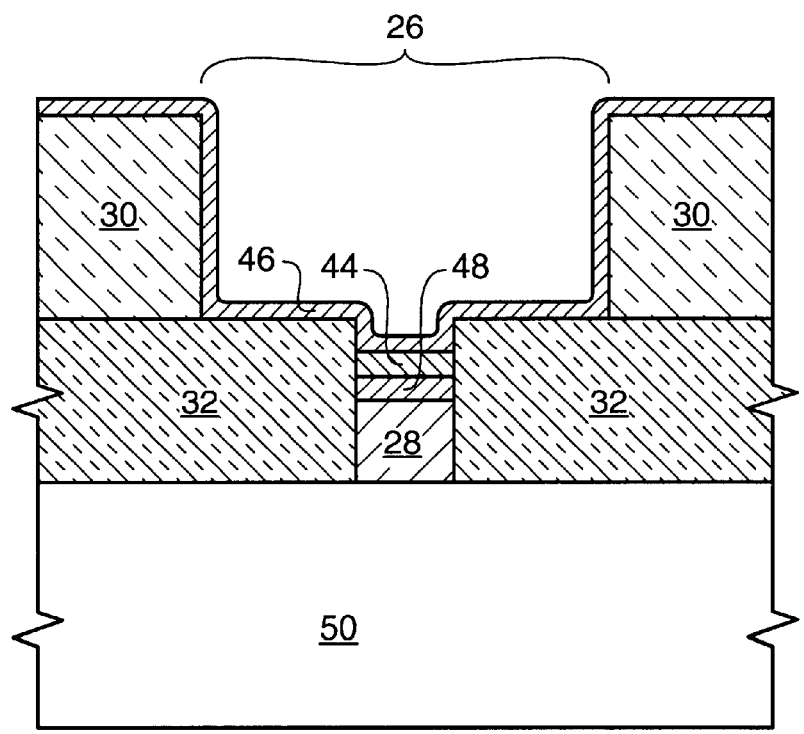
Figure 9E:
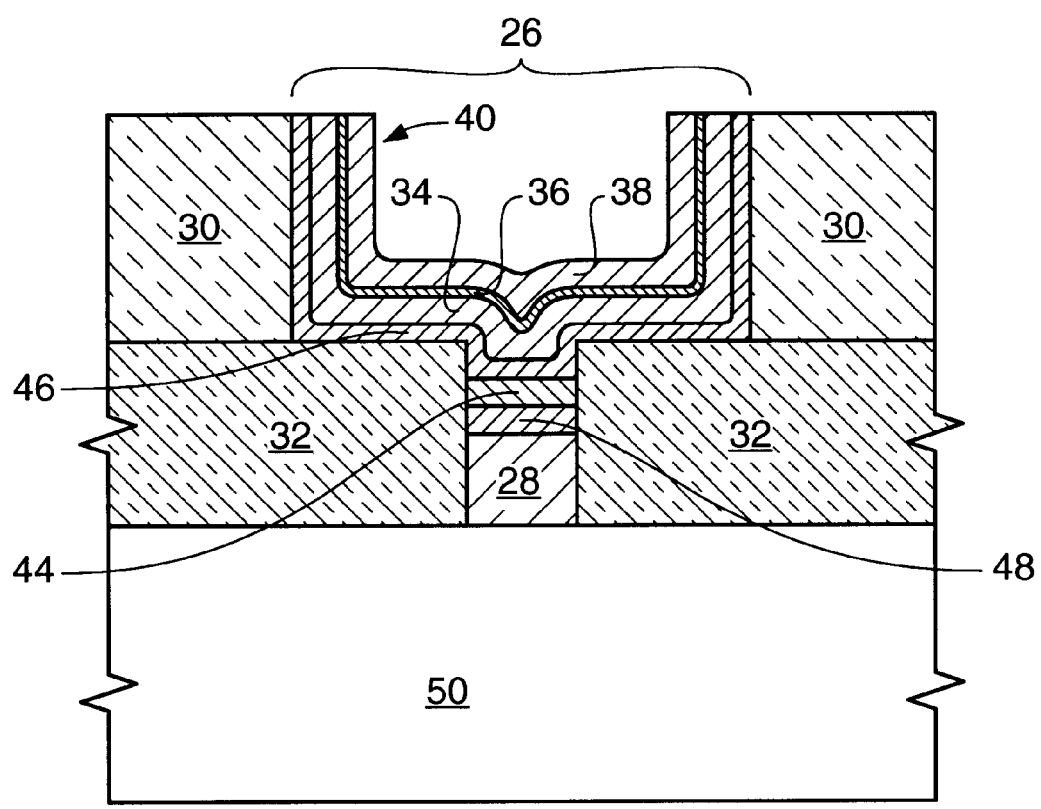

For purposes of clarity, FIGS. 9A through 9E reiterate a preferred embodiment of the current invention. A low surface for the poly plug 28 is provided as depicted in FIG. 9A. In FIG. 9B, an initial barrier component 42 including titanium is selectively deposited through CVD. The deposition conditions cause the titanium to react with the silicon in the poly plug 28 to form titanium silicide, thereby allowing the initial barrier component 42 to act as an electrical contact enhancement layer 48. FIG. 9C demonstrates that the top portion of the electrical contact enhancement layer 48 is subsequently nitridized to form the diffusion barrier 44. Next, an oxidation protection layer 46 made of ruthenium or ruthenium oxide is conformally layered within the container 26 and over the diffusion barrier 44, as seen in FIG. 9D. With the completion of the interface—comprising layers 44, 46, and 48—prior art steps may then be resumed, such as those depicted in FIG. 9E, involving layering the bottom plate 34, dielectric 36, and top plate 38 of a capacitor 40 over the oxidation protection layer 46. Planarization may also be performed as appropriate.

Figure 10A:
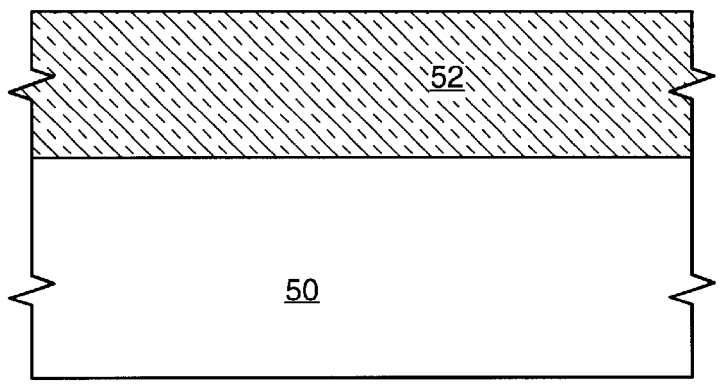
FIGS. 10A through 10D illustrate a damascene process as known in the art.
Figure 10B:
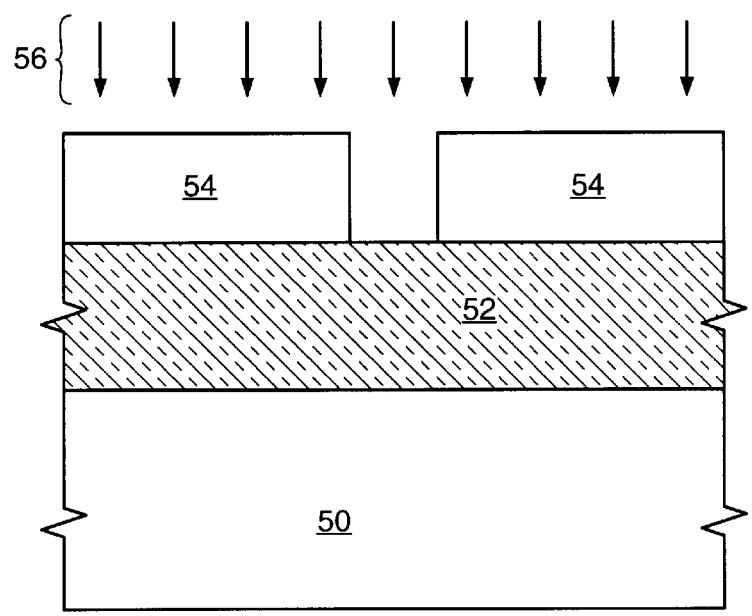
Figure 10C:
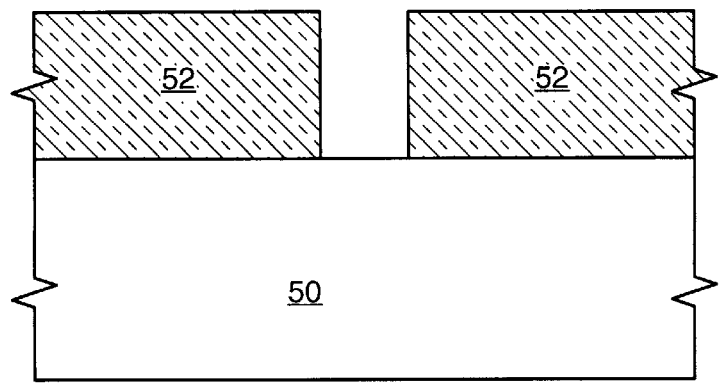
Figure 10D:
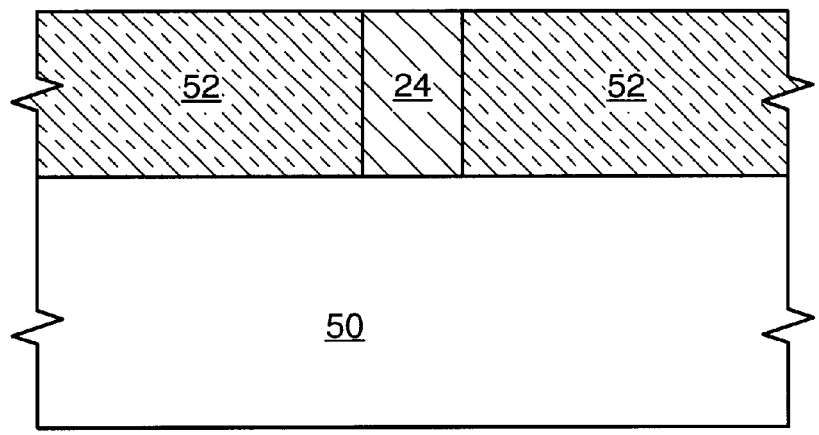
Figure 10E:
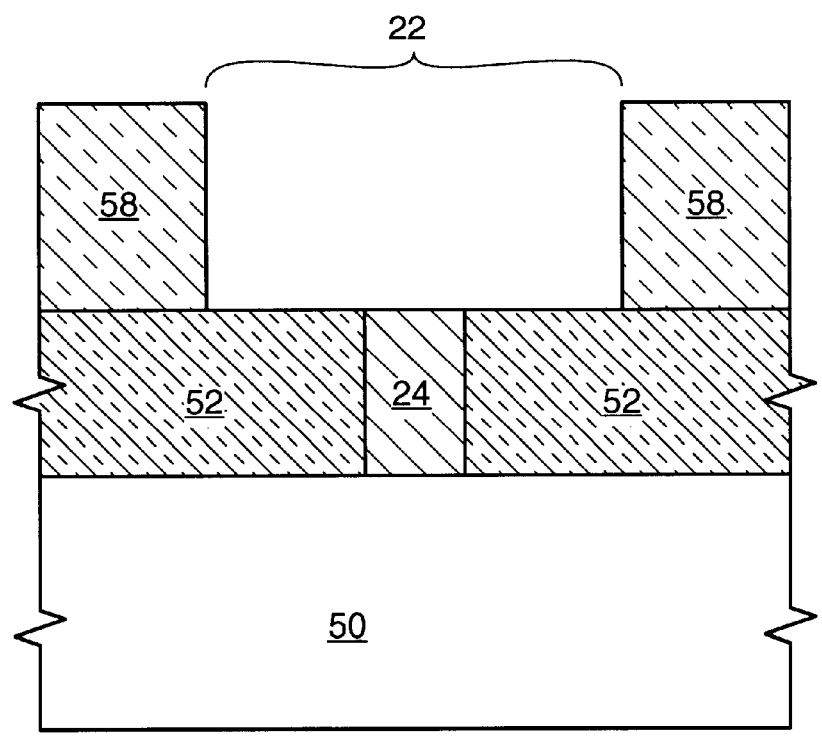
FIGS. 10E and 10F demonstrate the known way to complete an interconnect structure that began with the damascene process in FIGS. 10A–10D.
Figure 10F:
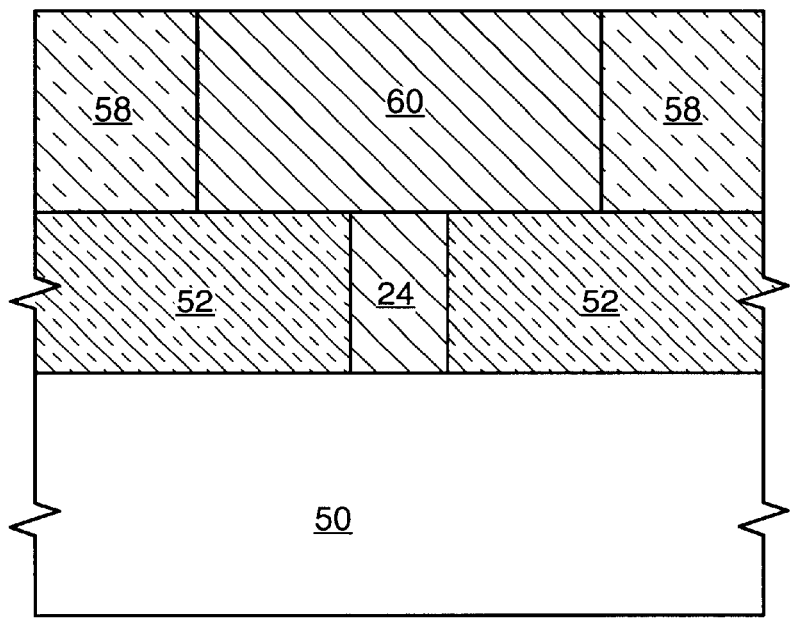

As mentioned above, the current invention can also play a part in a damascene process, which may be used to form an electrical connection between two portions of a semiconductor circuit. For example, a damascene structure can serve as an interconnect between a bit line or word line and a device such as a transistor. Damascene essentially involves forming a hole within an insulation layer and filling that hole with metal, as opposed to etching away undesired portions of a continuous metal layer and surrounding the remaining portions with insulation. The process for forming a damascene structure as known in the prior art is depicted in FIGS. 10A through 10D. FIG. 10A shows a first insulative layer 52 formed over the substrate 50. In FIG. 10B, a photoresist pattern 54 is formed over the first insulative layer 52. Etchants, indicated by the arrows 56, remove a portion of the first insulative layer 52 that is not protected by the photoresist pattern 54, as seen in FIG. 10C. This portion is filled with a conductive material 24 which, in this case, is assumed to be doped polysilicon. FIG. 10D illustrates that any conductive material above the surface of the insulative layer 52 is removed through processes such as planarization. Once the damascene structure is completed, further processing completes the interconnect structure. For example, FIG. 10E indicates that a second insulative layer 58 is subsequently formed over the first insulative layer 52 and is patterned and etched to expose an opening 22 above the conductive material 22. FIG. 10F illustrates that this opening 22 is then filled with a conductive wiring material 60, which may serve as a bit line or word line.

Figure 10G:
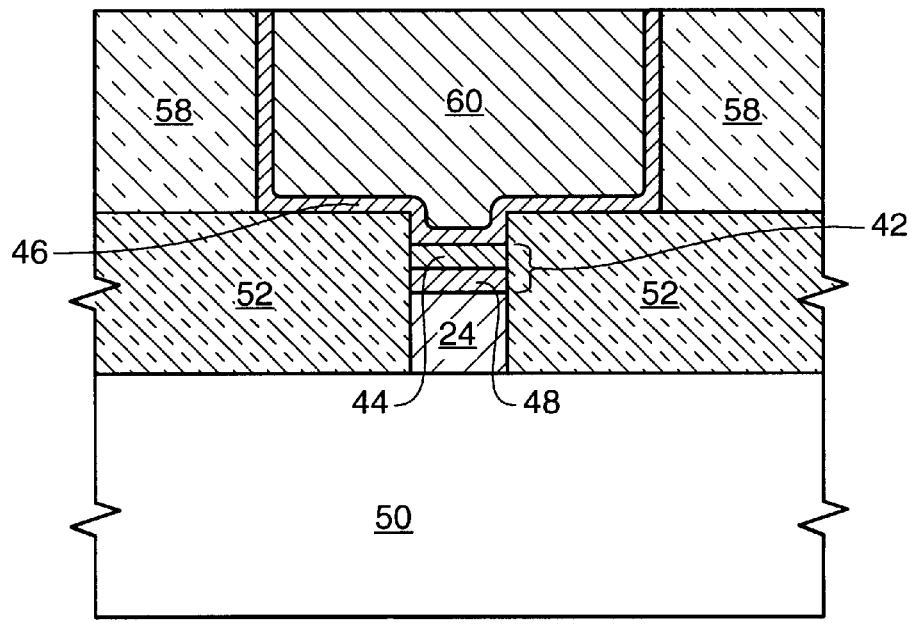
FIG. 10G represents another exemplary embodiment of the current invention.

FIG. 10G illustrates an embodiment of the current invention in the context of a damascene process. After the first insulative layer 52 has been etched, the portion that has been etched away is replaced with the polysilicon conductive material 24. Preferably, the surface of the conductive material 24 is lower that the surface of the first insulative layer 52. More preferably, the surface of the conductive material 24 is about half-way between the surface of the first insulative layer 52 and the substrate 50. Next, an initial barrier component 42 including titanium is selectively deposited upon the conductive material 24 and silicided in that deposition process. The initial barrier component 42 is subsequently nitridized to form a diffusion barrier 44, while the remaining silicided portion forms an electrical contact enhancement layer 48. Once the oxidation protection layer 46 is formed using a Pt-group metal or an oxide of a Pt-group metal, the conductive wiring material 60 may be deposited within opening 22. It follows that any of the materials discussed under prior embodiments could be used for the diffusion barrier 44, electrical contact enhancement layer 48, and the oxidation protection layer 46 of this damascene example.

Figure 11:
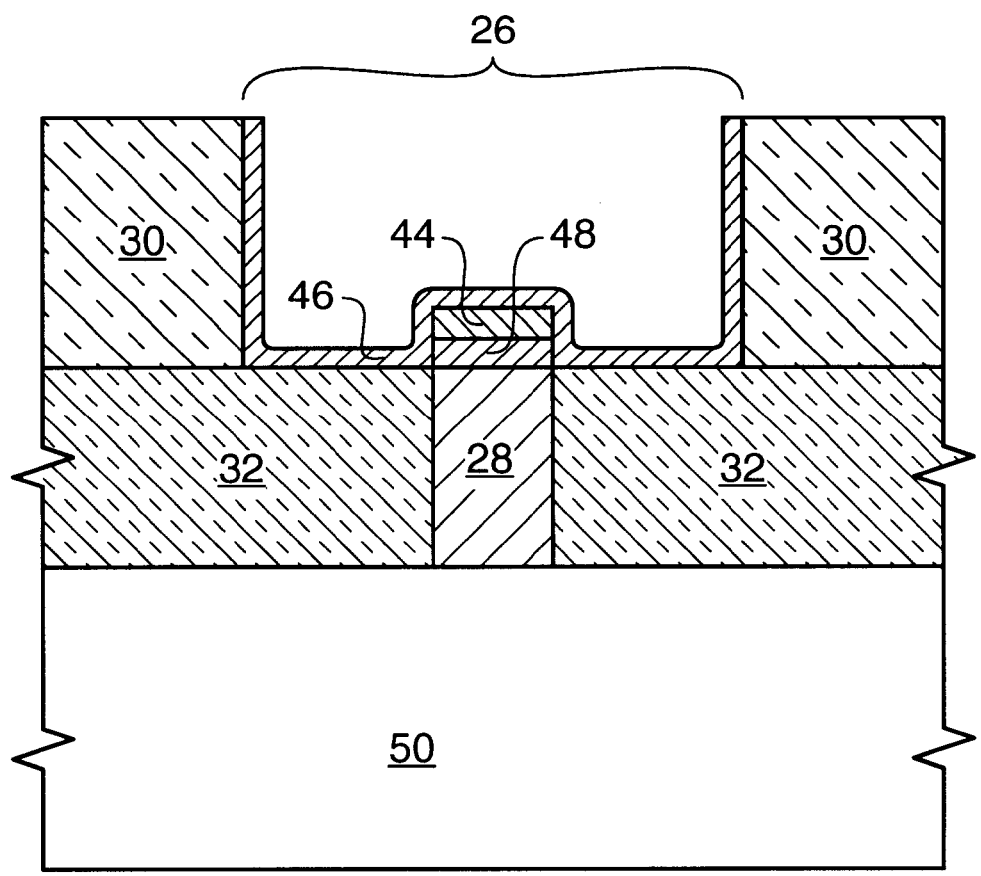
FIG. 11 is yet another exemplary embodiment of the current invention.
Figure 12A:
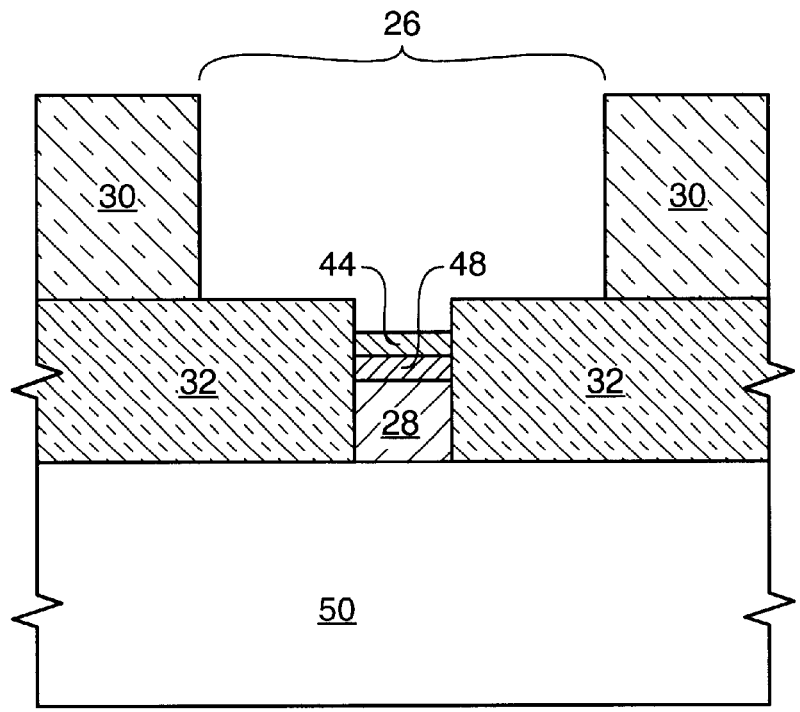
FIGS. 12A and 12B are still other exemplary embodiments of the current invention.
Figure 12B:
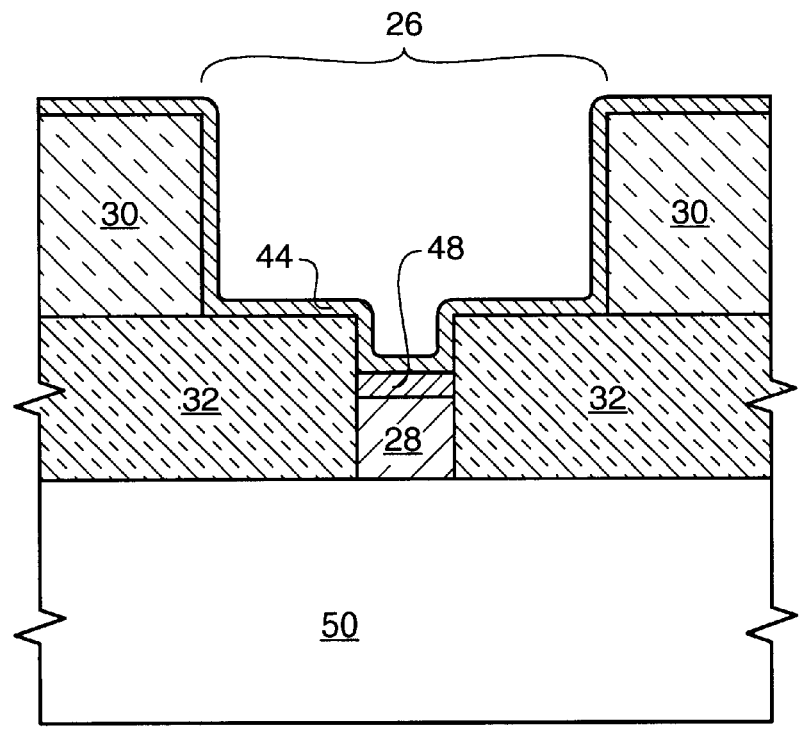

One skilled in the art can appreciate that, although specific embodiments of this invention have been described above for purposes of illustration, various modifications may be made without departing from the spirit and scope of the invention. For example, FIG. 11 depicts an embodiment wherein the poly plug 28 is not recessed. As another example, shown in FIG. 12A, it is not necessary that the diffusion barrier 44 and the electrical contact enhancement layer 48 originate from the same material. In this example, the electrical contact enhancement layer 48 results from the silicidation of a selectively CVD'd titanium layer. The diffusion barrier 44, on the other hand, comes from nitridizing a tungsten layer that is over only the poly plug 28. Similarly, the diffusion barrier 44 in FIG. 12B comes from nitridizing a tungsten layer that conforms to the container 26 and overlies the $TiSi_x$ electrical contact enhancement layer 48. Moreover, the current invention can be used in any situation wherein silicon is used to make an electrical contact. In addition, it should be noted that the invention becomes more beneficial as the silicon contact area decreases in size. Further, the end product and in-process versions of the product are also included within the scope of this invention. Finally, one skilled in the art can appreciate that the cross sections depicted the figures are not to scale. Rather, particular elements, such as the layers discussed above, are sized to clearly indicate embodiments of the current invention. Accordingly, the invention is not limited except as stated in the claims.

What is claimed is:

1. A method of establishing electrical contact between a semiconductor substrate and a semiconductor device, comprising:

covering said substrate with an insulating layer;

etching a hole through said insulating layer to said substrate;

partially plugging said hole with doped polycrystalline silicon;

depositing at least one metal layer within said hole over said doped polycrystalline silicon;

nitridizing said at least one metal layer, wherein said step of nitridizing, said at least one metal layer comprises nitridizing a tungsten layers;

siliciding said at least one metal layer, wherein said step of siliciding said at least one metal layer comprises siliciding a titanium layer, and forming said semiconductor device over said at least one metal layer.

* * * * *

UNITED STATES PATENT AND TRADEMARK OFFICE
CERTIFICATE OF CORRECTION

PATENT NO.    : 6,780,758 B1
DATED         : August 24, 2004
INVENTOR(S)   : Garo J. Derderian et al.

It is certified that error appears in the above-identified patent and that said Letters Patent is hereby corrected as shown below:

Column 5,
Line 52, after the ratio "50:1" delete the comma "," and replace it with a period -- . --.

Column 8,
Line 5, delete "layers" and replace it with -- layer --;
Line 58, delete the comma "," and replace it with a semicolon -- ; --.

Signed and Sealed this

Second Day of November, 2004

JON W. DUDAS
*Director of the United States Patent and Trademark Office*